US006958655B2

(12) United States Patent
Shirai

(10) Patent No.: US 6,958,655 B2
(45) Date of Patent: Oct. 25, 2005

(54) VARIABLE GAIN AMPLIFIER CIRCUIT USING VARIABLE IMPEDANCE CIRCUIT

(75) Inventor: Takahiro Shirai, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/833,027

(22) Filed: Apr. 28, 2004

(65) Prior Publication Data

US 2004/0217815 A1 Nov. 4, 2004

(30) Foreign Application Priority Data

Apr. 30, 2003 (JP) ....................................... 2003-125369

(51) Int. Cl.$^7$ ................................................ H03G 3/30
(52) U.S. Cl. ......................... 330/282; 330/86; 341/150
(58) Field of Search ................................ 330/282, 250, 330/86, 144, 284; 341/144, 150, 172, 145

(56) References Cited

U.S. PATENT DOCUMENTS

| | | | | |
|---|---|---|---|---|
| 4,628,276 A | * | 12/1986 | Mizutani | 330/86 |
| 5,233,309 A | * | 8/1993 | Spitalny et al. | 330/84 |
| 5,486,791 A | * | 1/1996 | Spitalny et al. | 330/282 |
| 6,344,780 B1 | * | 2/2002 | Dobashi et al. | 333/17.3 |
| 6,486,711 B1 | * | 11/2002 | Tsay et al. | 327/96 |

\* cited by examiner

*Primary Examiner*—John B Nguyen
(74) *Attorney, Agent, or Firm*—Fitzpatrick, Cella, Harper & Scinto.

(57) ABSTRACT

A variable gain amplifier circuit using a variable impedance circuit, includes an input terminal, an operational amplifier, a first variable impedance connected with the input terminal and the operational amplifier, a second variable impedance connected with a reverse input terminal of the operational amplifier and an output terminal of the operational amplifier, a third variable impedance whose first end is connected with the reverse input terminal of the operational amplifier, a fourth variable impedance whose first end is connected with the input terminal and second end is connected with a second end of the third variable impedance, and a fifth variable impedance whose first end is connected with the second end of the third variable impedance and second end is connected with the output terminal of the operational amplifier, wherein the first variable impedance, the second variable impedance, and the third variable impedance are controlled in accordance with an upper bit group, and the fourth variable impedance and the fifth variable impedance are controlled in accordance with a lower bit group.

5 Claims, 5 Drawing Sheets

| | |
|---|---|
| Cin | 3.330pF |
| Cout | 1.963pF |
| C1 | 0.346pF |

| UPPER CODE | UPPER CAPACITANCE | Cx |
|---|---|---|
| 0 | 0.314pF | |
| 1 | 0.325pF | 0.046pF |
| 2 | 0.337pF | 0.035pF |
| 3 | 0.341pF | 0.027pF |
| 4 | 0.345pF | 0.023pF |
| 5 | 0.346pF | 0.021pF |
| 6 | 0.345pF | 0.021pF |
| 7 | 0.340pF | 0.024pF |
| 8 | 0.333pF | 0.030pF |
| 9 | 0.324pF | 0.038pF |
| 10 | 0.311pF | 0.049pF |
| 11 | 0.298pF | 0.062pF |
| 12 | 0.282pF | 0.077pF |
| 13 | 0.265pF | 0.093pF |
| 14 | 0.247pF | 0.110pF |
| 15 | 0.230pF | 0.127pF |

VARIABLE GAIN AMPLIFIER CIRCUIT USING VARIABLE IMPEDANCE CIRCUIT

BACKGROUND OF THE INVENTION

1. Field of the Invention

The present invention relates to a variable gain amplifier circuit for amplifying an input signal with a geometrically controlled gain in accordance with a digital control signal.

2. Related Background Art

Up to now, as shown in FIG. 8, a conventional variable gain amplifier for amplifying an input signal with a geometrically controlled gain in accordance with an n-bit digital control signal includes: an operational amplifier; ($2^{n+1}$) capacitors in each of which one terminal is connected to an reverse input terminal of the operational amplifier; and switches for connecting the other terminals of ($2^{n-1}$) of the capacitors to an input terminal or an output terminal. The switches are controlled in accordance with an output of an n-bit decoder.

Here, more specifically, it is assumed that a variable gain amplifier geometrically controls input and output gains between 0.5 times to 4 times using an 8-bit digital signal. If the total capacitance is 10 pF, capacitance fixedly connected between the input terminal and the reverse input terminal of the operational amplifier will be 3.3333 pF, capacitance fixedly connected between the output terminal and the reverse input terminal of the operational amplifier will be 2 pF, capacitance whose connection is first switched from the output terminal to the input terminal will be 0.0181 pF, and capacitor whose connection is finally switched from the output terminal to the input terminal will be 0.0131 pF. Therefore, a ratio between the fixedly connected capacitance and the capacitance whose connection is switched becomes 100 times or more, so that it is hard to realize these capacitances with high precision. In addition, the number of capacitors switched between the input terminal and the output terminal and the number of switches becomes 255. Therefore, even when the variable gain amplifier is realized, an increase in layout area is caused.

A second conventional art with respect to a variable gain amplifier, as shown in FIG. 9, is a circuit in which an m-bit variable gain amplifier and an (n-m)-bit variable gain amplifier are connected in series with each other. More specifically, it is assumed that the variable gain amplifier that geometrically controls the input and output gains between 0.5 times to 4 times using the 8-bit digital signal and a 4-bit variable gain amplifier are connected as two stages in series with each other. In case that variable gain range of the variable gain amplifier of the preceding stage is set to 0.5 times to 3.5395 times to be controlled using upper 4-bits, capacitance fixedly connected between the input terminal and the reverse input terminal of the operational amplifier will be 3.3333 pF, capacitance fixedly connected between the output terminal and the reverse input terminal of the operational amplifier will be 2.2029 pF, capacitance whose connection is first switched from the output terminal to the input terminal will be 0.2960 pF, and capacitance whose connection is finally switched from the output terminal to the input terminal will be 0.2323 pF. In case that a variable gain range of the variable gain amplifier of the following stage is set to 1 time to 1.1301 times to be controlled using lower 4-bits, capacitance fixedly connected between the input terminal and the reverse input terminal of the operational amplifier will be 5 pF capacitance fixedly connected between the output terminal and the reverse input terminal of the operational amplifier will be 4.6946 pF capacitance whose connection is first switched from the output terminal to the input terminal will be 0.0204 pF and capacitance whose connection is finally switched from the output terminal to the input terminal will be 0.0203 pF.

Because a capacitance ratio in the following stage is equal to or larger than 100 times, a structure as shown in FIG. 10 may be used in order to reduce the capacitance ratio. According to the structure, a capacitor is inserted between the reverse input terminal of the operational amplifier and the capacitors whose connections are switched between the input and output terminals. Therefore, an effective capacitance value can be reduced to reduce the capacitance ratio. Assume that the inserted capacitor and the switched capacitors each have the same capacitance for ease of calculation. Then, capacitance fixedly connected between the input terminal and the reverse input terminal of the operational amplifier will be 5 pF, capacitance fixedly connected between the output terminal and the reverse input terminal of the operational amplifier will be 4.6549 pF and inserted capacitance and capacitances whose connections are switched from the output terminal to the input terminal will be 0.3676 pF. When the switched capacitors have the same capacitance, a gain error is up to 0.0034% to be sufficiently small, thereby being negligible. In the case of such a structure, two operational amplifiers are required. However, the number of capacitors and the number of switches, which compose a feedback loop can be greatly reduced to about 30. In addition, it is easy to realize because a structure of the decoder is simplified. However, a noise is caused in each amplifying stage. Therefore, a noise characteristic deteriorates as compared with the first conventional art.

SUMMARY OF THE INVENTION

An object of the present invention is to provide a variable gain amplifier circuit for amplifying an input signal with a geometrically controlled gain in accordance with an n-bit digital control signal, in which a layout area in IC implementation is reduced and a noise characteristic is prevented from deteriorating.

In order to achieve the above-mentioned object, according to an aspect of the present invention, a variable gain amplifier circuit of the present invention, using a variable impedance circuit, includes: an input terminal; an operational amplifier; a first variable impedance connected with the input terminal and the operational amplifier; a second variable impedance connected with a reverse input terminal of the operational amplifier and an output terminal of the operational amplifier; a third variable impedance whose first end is connected with the reverse input terminal of the operational amplifier; a fourth variable impedance whose first end is connected with the input terminal and whose second end is connected with a second end of the third variable impedance; and a fifth variable impedance whose first end is connected with the second end of the third variable impedance and whose second end is connected with the output terminal of the operational amplifier, wherein the first variable impedance, the second variable impedance, and the third variable impedance are controlled in accordance with an upper bit group, and wherein the fourth variable impedance and the fifth variable impedance are controlled in accordance with a lower bit group.

Other objects and features of the present invention will be apparent upon reading the following description taken in conjunction with the accompanying drawings.

DESCRIPTION OF THE PREFERRED EMBODIMENTS

Figure 1:
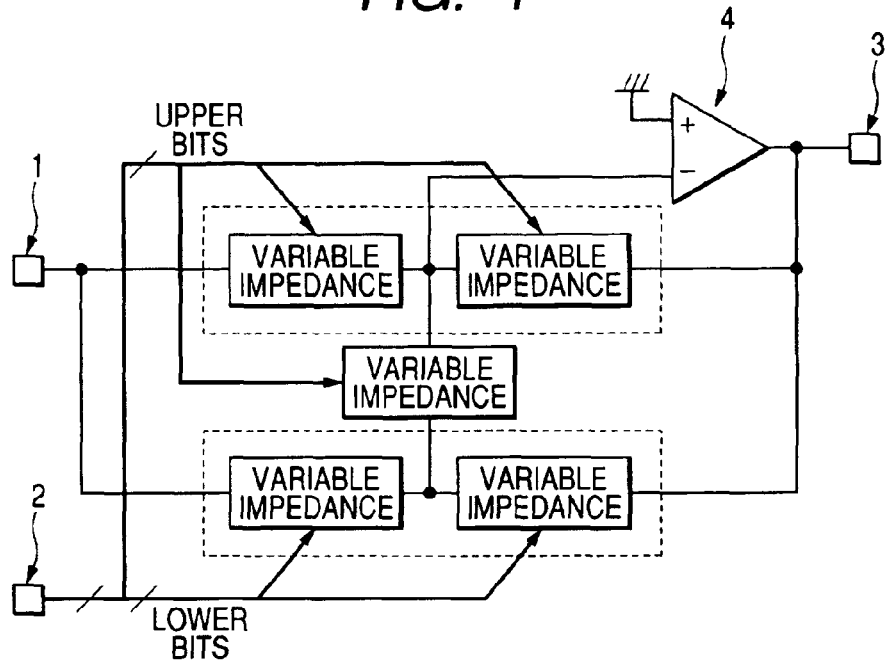
FIG. 1 is a circuit diagram showing a feature of the present invention.

FIG. 1 is a circuit diagram showing a feature of the present invention. Digital control bits are divided into an upper control bit group and a lower control bit group. The upper control bit group controls an upper variable impedance group corresponding thereto and a variable impedance for connecting a common connection point of a lower variable impedance group with a common connection point of the upper variable impedance group. The lower control bit group controls the lower variable impedance group corresponding thereto.

Figure 2:
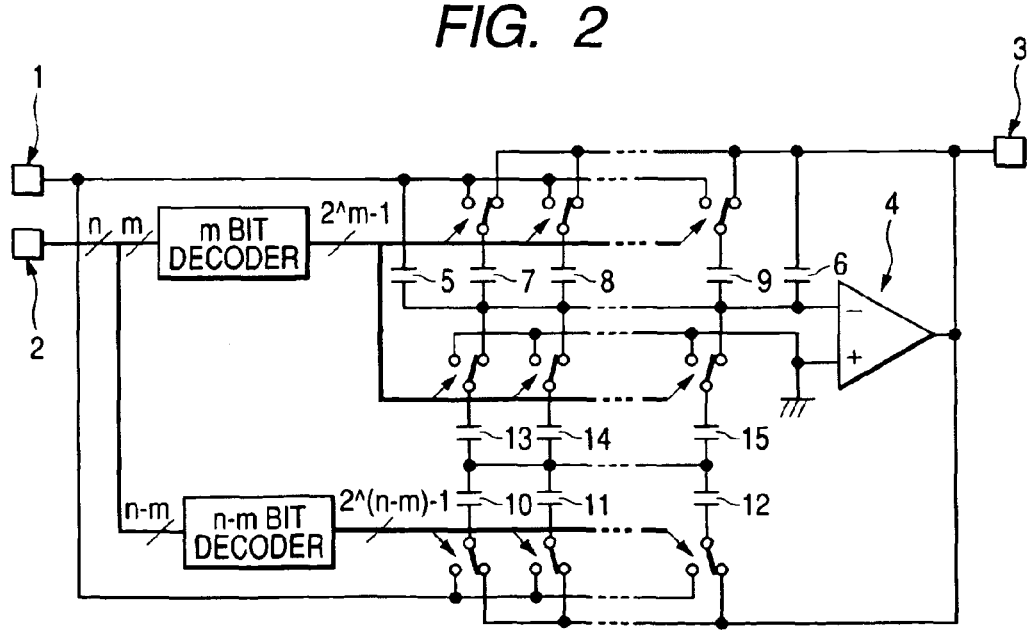
FIG. 2 is a circuit diagram showing a variable gain amplifier circuit according to an embodiment of the present invention.

An embodiment of the present invention will be described in detail with reference to FIG. 2. In FIG. 2, a variable gain amplifier circuit includes a signal input terminal 1, a digital control signal input terminal 2, a signal output terminal 3, and an operational amplifier 4. In addition, the variable gain amplifier circuit includes a capacitor 5 fixedly connected between the signal input terminal 1 and a reverse input terminal of the operational amplifier 4 and a capacitor 6 fixedly connected between the signal output terminal 3 and the reverse input terminal of the operational amplifier 4. Further, the variable gain amplifier circuit includes a group of uppermost variable capacitor circuits 7 to 9, a group of lower variable capacitor circuits 10 to 12, and a group of variable capacitor circuits 13 to 15 for connecting a common connection point of the group of the lower variable capacitor circuits 10 to 12 with the reverse input terminal of the operational amplifier 4. Of n-bits of a digital control signal inputted from the digital control signal input terminal 2, an upper digital control signal of m-bits is decoded by an m-bit decoder. Therefore, the connection between the group of the upper variable capacitor circuits and the group of the maximum variable capacitor circuits is controlled according to a decoded signal. A digital control signal of (n-m)-bits is decoded by an (n-m)-bit decoder. Therefore, the connection with respect to the group of the lower variable capacitor circuits is controlled according to a decoded signal. A signal inputted from the signal input terminal 1 is subjected to gain control determined by a network of the capacitor circuits and the operational amplifier 4 and outputted from the signal output terminal 3. The capacitance values of the respective capacitors are determined according to a necessary gain control range and the necessary number of control bits. Here, as in the conventional art, the calculation will be performed on a variable gain amplifier that geometrically controls input and output gains between 0.5 times to 4 times using a 8-bit digital signal having upper 4-bits and lower 4-bits.

First, referring to a circuit diagram for calculating capacitance values of capacitors (FIG. 3), a gain in such a circuit state is calculated. Here, assume that a maximum capacitance value of a variable capacitor for connecting with a common terminal of lower variable capacitors with the reverse input terminal of the operational amplifier 4 is given by C1. In addition, assume that a variable capacitor Cx of the variable capacitors is connected with a constant voltage terminal according to a state of the upper control bits. Further, assume that an open loop gain of the operational amplifier 4 is sufficiently high, thereby establishing a virtual ground between the input terminals thereof. When a voltage on the signal input terminal is given by Vin, a voltage on the signal output terminal is given by Vout, and a voltage at a connection point of four capacitors is given by V1, the following two expressions are obtained from current conservation law at the reverse input terminal and the connection point of the four capacitors.

$$s \cdot Cin \cdot Vin + s \cdot (C1-Cx) \cdot V1 + s \cdot Cout \cdot Vout = 0$$

$$s \cdot n \cdot C1 \cdot (Vin-V1) + s \cdot (16-n) \cdot C1 \cdot (Vout-V1) - s \cdot C1 \cdot V1 = 0$$

When input and output gains are calculated based on the expressions, $$Vout = \frac{Cin + \frac{n}{17} \cdot (C1 - Cx)}{Cout + \frac{16-n}{17} \cdot (C1 - Cx)} \cdot Vin$$

Figures 3, 4:
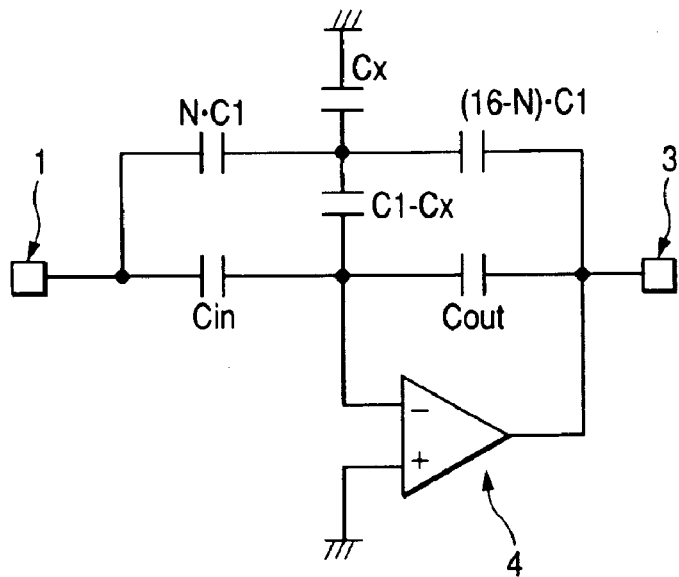
FIG. 3 is a circuit diagram for calculating capacitance values of capacitors.
FIG. 4 is a table showing examples of the capacitance values of the respective capacitors.
Figure 5:
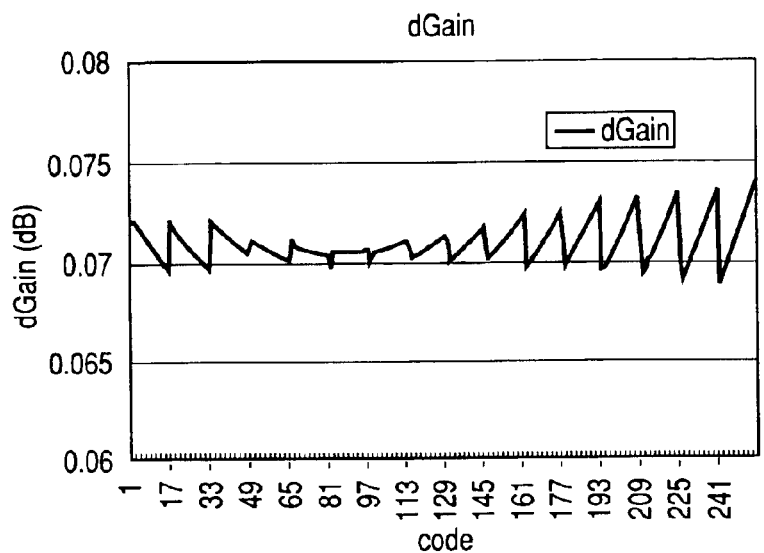
FIG. 5 is a graph showing a characteristic example on calculation.

In actual calculation, the capacitance values of the respective capacitors are first calculated using a condition of Cx=0 and n=0. Next, Cx may be calculated so as not to greatly change a gain when the upper control bits are changed, thereby determining the capacitance values of the respective capacitors. FIG. 4 shows a table of actually determined capacitance values of the respective capacitors. FIG. 5 is a graph showing a calculated gain ratio between adjacent codes. Ideally, the gain ratio between adjacent codes should be 0.07083 dB. However, a gain error of 0.005 dB or less is caused because the lower capacitors are made to have the same capacitance value. This is an error equal to about 7% of an average gain increase, so that it hardly becomes a problem in practice. When values of Cx shown in FIG. 4 are actually realized, it is necessary to use weighted capacitors as the variable capacitor circuits 13 to 15 shown in FIG. 2 and to operate a plurality of switches according to a decoded value of the upper signal control bits.

Figure 6:
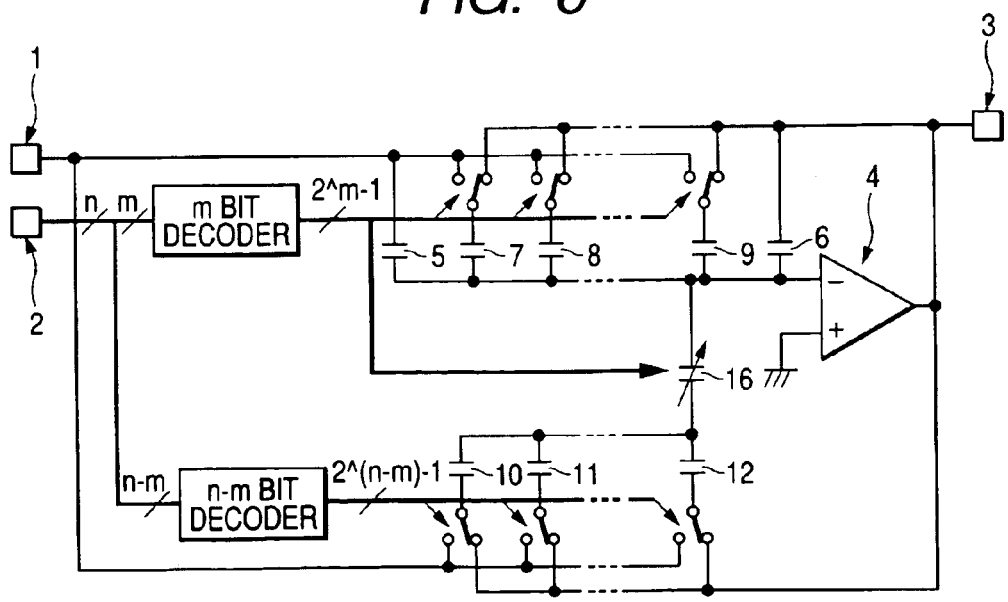
FIG. 6 is a circuit diagram showing a variable gain amplifier circuit according to another embodiment of the present invention.
Figure 7:
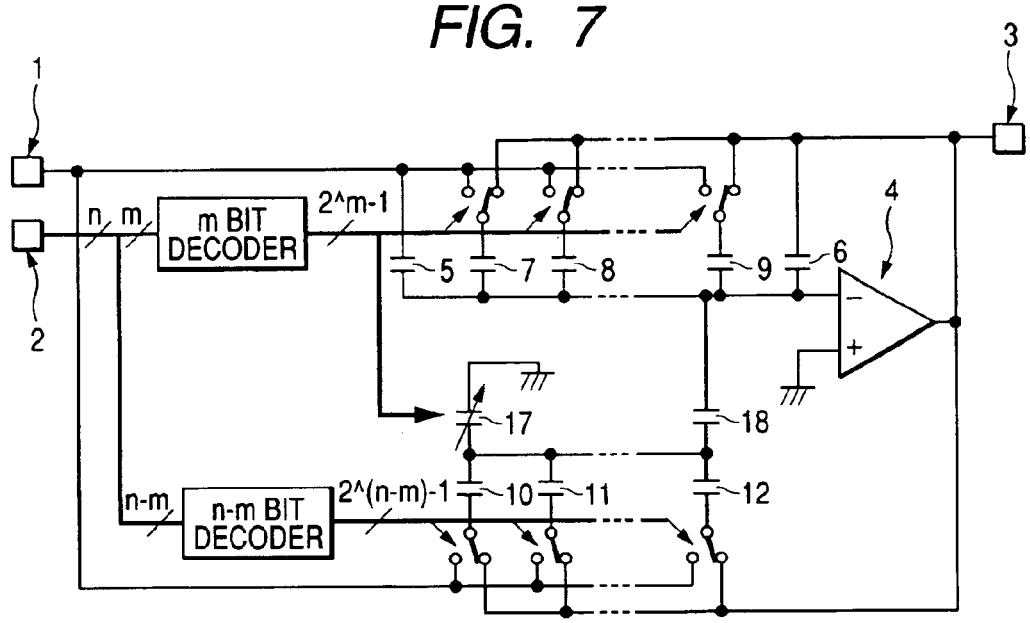
FIG. 7 is a circuit diagram showing a variable gain amplifier circuit according to still another embodiment of the present invention.
Figure 8:
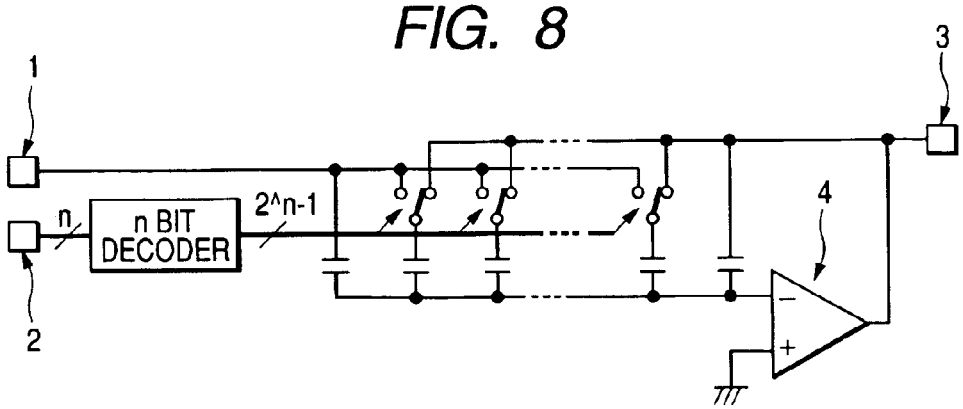
FIG. 8 is a circuit diagram showing a conventional circuit example.
Figure 9:
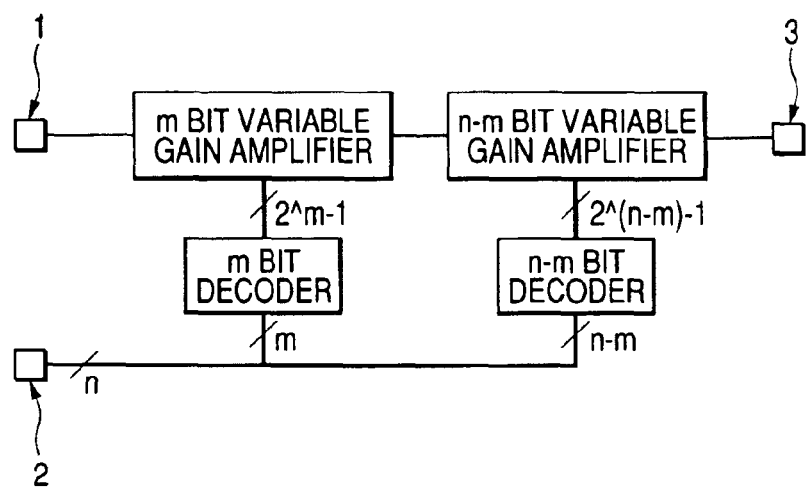
FIG. 9 is a circuit diagram showing another conventional circuit example.
Figure 10:
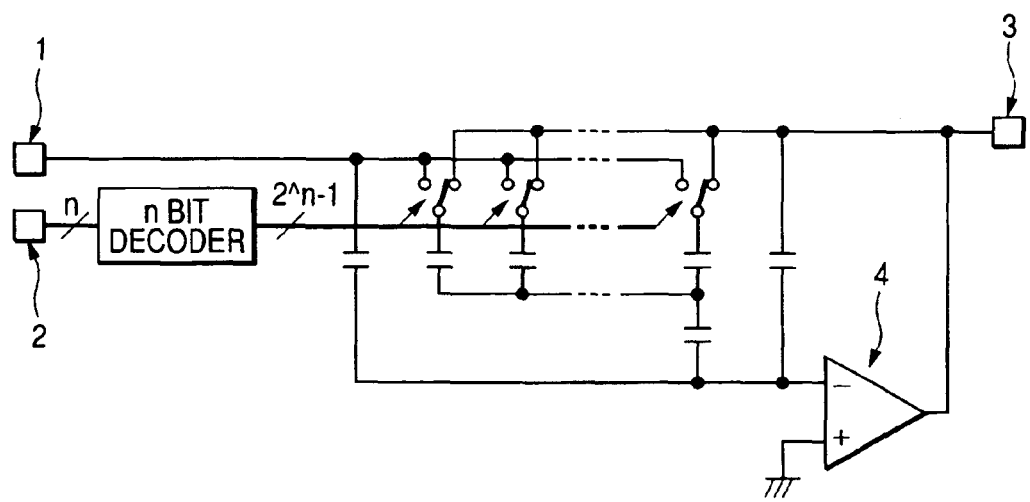
FIG. 10 is a circuit diagram related to a conventional method of reducing a ratio among capacitance values of capacitors.

FIGS. 6 and 7 show another embodiments of the present invention. In the embodiment shown in FIG. 6, the variable capacitor circuits 13 to 15 according to the embodiment shown in FIG. 2 are replaced by a variable capacitor 16. In the embodiment shown in FIG. 7, the variable capacitor circuits 13 to 15 according to the embodiment shown in FIG. 2 are replaced by variable capacitors 17 and 18.

When a variable gain amplifier circuit is actually realized as an IC, a simulation based on parasitic elements as well or an adjustment based on a measured result is required to correct effects resulting from capacitors and the parasitic elements related to wirings.

As described above, according to those embodiments, the variable gain amplifier circuit capable of geometrically setting a gain in accordance with a digital control signal can be constructed with a circuit size smaller than a conventional variable gain amplifier circuit. In addition, a layout area in IC implementation can be reduced. Therefore, there is a merit in cost.

Also, the amplifier circuit is constructed at one stage. Therefore, a preferable noise characteristic can be obtained as compared with the conventional case where the amplifier circuit is constructed at plural stages.

Many widely different embodiments of the present invention may be constructed without departing from the spirit and scope of the present invention. It should be understood that the present invention is not limited to the specific embodiments described in the specification, except as defined in the appended claims.

What is claimed is:

1. A variable gain amplifier circuit using a variable impedance circuit, comprising:

an input terminal;

an operational amplifier;

a first variable impedance connected with the input terminal and a reverse input terminal of the operational amplifier;

a second variable impedance connected with the reverse input terminal of the operational amplifier and an output terminal of the operational amplifier;

a third variable impedance whose first end is connected with the reverse input terminal of the operational amplifier;

a fourth variable impedance whose first end is connected with the input terminal and whose second end is connected with a second end of the third variable impedance; and a fifth variable impedance whose first end is connected with the second end of the third variable impedance and whose second end is connected with the output terminal of the operational amplifier, wherein the first variable impedance, the second variable impedance, and the third variable impedance are controlled in accordance with an upper bit group; and wherein the fourth variable impedance and the fifth variable impedance are controlled in accordance with a lower bit group.

2. A variable gain amplifier circuit capable of geometrically setting input and output gains of an input signal and an output signal in accordance with a digital control signal composed of a plurality of digital control bit groups, the input signal being inputted to a signal input terminal, the output signal being outputted to a signal output terminal, comprising:

a variable impedance circuit; and an amplifier circuit, wherein the amplifier circuit comprises a reverse input terminal and an output terminal connected with the signal output terminal; and wherein the variable impedance circuit comprises two or more variable impedance circuit groups;

each of the variable impedance circuit groups comprises a first variable impedance in which one end is connected with a first terminal and the other end is connected with a second terminal and a second variable impedance in which one end is connected with the first terminal and the other end is connected with a third terminal, a level of each of the impedances being set in accordance with a digital control bit group corresponding to each of the variable impedance circuit groups;

a highest variable impedance circuit group of the variable impedance circuit groups connects the second terminal with the signal input terminal, connects the first terminal with the reverse input terminal, and connects the third terminal with the signal output terminal;

the variable impedance circuit group other than the highest variable impedance circuit group connects the second terminal with the signal input terminal, connects the third terminal with the signal output terminal, and connects the first terminal with one end of the variable impedance corresponding to each of the variable impedance circuit groups;

the other end of each of the variable impedance is connected with one of the reverse input terminal and the first terminal of a variable impedance circuit group higher than the variable impedance circuit group corresponding to each of the impedances; and the variable impedance is controlled in accordance with a higher digital control bit group higher than a digital control bit group for controlling the variable impedance circuit group corresponding to each of the impedances.

3. A variable gain amplifier circuit capable of geometrically setting input and output gains of an input signal and an output signal in accordance with a digital control signal composed of a plurality of digital control bit groups, the input signal being inputted to a signal input terminal, the output signal being outputted to a signal output terminal, comprising:

a variable impedance circuit; and an amplifier circuit, wherein the amplifier circuit comprises a reverse input terminal and an output terminal connected with the signal output terminal; and wherein the variable impedance circuit comprises two or more variable impedance circuit groups;

each of the variable impedance circuit groups comprises a plurality of impedances in each of which one end is connected with a first terminal and the other end is connected with one of a second terminal and a third terminal in accordance with a digital control bit group corresponding to each of the variable impedance circuit groups;

a highest variable impedance circuit group of the variable impedance circuit groups connects the second terminal with the signal input terminal, connects the first terminal with the reverse input terminal, and connects the third terminal with the signal output terminal;

the variable impedance circuit group other than the highest variable impedance circuit group connects the second terminal with the signal input terminal, connects the third terminal with the signal output terminal, and connects the first terminal with one end of the variable impedance corresponding to each of the variable impedance circuit groups;

the other end of each of the variable impedances is connected with one of the reverse input terminal and the first terminal of a higher variable impedance circuit group than the variable impedance circuit group corresponding to each of the impedances; and the impedance is controlled in accordance with a higher digital control bit group than a digital control bit group for controlling the variable impedance circuit group corresponding to each of the impedances.

4. A variable gain amplifier circuit capable of geometrically setting input and output gains of an input signal and an output signal in accordance with a digital control signal composed of a plurality of digital control bit groups, the input signal being inputted to a signal input terminal, the output signal being outputted to a signal output terminal, comprising:

a variable impedance circuit; and an amplifier circuit, wherein the amplifier circuit comprises a reverse input terminal and an output terminal connected with the signal output terminal; and wherein the variable impedance circuit comprises two or more variable impedance circuit groups;

each of the variable impedance circuit groups comprises a plurality of impedances in each of which one end is connected with a first terminal and the other end is connected with one of a second terminal and a third terminal in accordance with a digital control bit group corresponding to each of the variable impedance circuit groups;

a highest variable impedance circuit group of the variable impedance circuit groups connects the second terminal with the signal input terminal, connects the first terminal with the reverse input terminal, and connects the third terminal with the signal output terminal;

the variable impedance circuit group other than the highest variable impedance circuit group connects the second terminal with the signal input terminal, connects the third terminal with the signal output terminal, and connects the first terminal with one end of each of the impedances corresponding to the variable impedance circuit group and one end of the variable impedance;

the other end of each of the impedances is connected with one of the reverse input terminal and the first terminal of a higher variable impedance circuit group than the variable impedance circuit group corresponding to each of the impedances; and the other end of the variable impedance is connected with a fixed potential and the variable impedance is controlled in accordance with a higher digital control bit group than a digital control bit group for controlling the variable impedance circuit group corresponding to each of the impedances.

5. A variable gain amplifier circuit capable of geometrically setting input and output gains of an input signal and an output signal in accordance with a digital control signal composed of a plurality of digital control bit groups, the input signal being inputted to a signal input terminal, the output signal being outputted to a signal output terminal, comprising:

a variable impedance circuit; and an amplifier circuit, wherein the amplifier circuit comprises a reverse input terminal and an output terminal connected with the signal output terminal; and wherein the variable impedance circuit comprises two or more variable impedance circuit groups;

each of the variable impedance circuit groups comprises a plurality of impedances in each of which one end is connected with a first terminal and the other end is connected with one of a second terminal and a third terminal in accordance with a digital control bit group corresponding to each of the variable impedance circuit groups;

a highest variable impedance circuit group of the variable impedance circuit groups connects the second terminal with the signal input terminal, connects the first terminal with the reverse input terminal, and connects the third terminal with the signal output terminal;

the variable impedance circuit group other than the highest variable impedance circuit group connects the second terminal with the signal input terminal, connects the third terminal with the signal output terminal, and connects the first terminal with one end of the variable impedance corresponding to the variable impedance circuit group;

each of the variable impedances comprises a plurality of impedances; and the other end of each of the plurality of impedances is controlled to be connected with one of the reverse input terminal and the first terminal of a variable impedance circuit group higher than the variable impedance circuit group corresponding to each of the plurality of impedances, in accordance with a higher digital control bit group than a digital control bit group for controlling the variable impedance circuit group corresponding to one of fixed potentials.

* * * * *